US012781105B2

(12) United States Patent
Kim et al.

(10) Patent No.: US 12,781,105 B2
(45) Date of Patent: Nov. 3, 2026

(54) ADHESIVE AND DISPLAY DEVICE

(71) Applicant: Samsung Display Co., LTD., Yongin-si (KR)

(72) Inventors: On Nu Ri Kim, Hwaseong-si (KR); Young Hye Son, Seoul (KR); Sang Gu Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 158 days.

(21) Appl. No.: 18/615,176

(22) Filed: Mar. 25, 2024

(65) Prior Publication Data

US 2024/0228842 A1 Jul. 11, 2024

Related U.S. Application Data

(62) Division of application No. 17/411,758, filed on Aug. 25, 2021, now Pat. No. 11,965,118.

(30) Foreign Application Priority Data

Nov. 13, 2020 (KR) ........................ 10-2020-0151945

(51) Int. Cl.

| | |
|---|---|
| ***C09J 133/08*** | (2006.01) |
| ***C08F 20/06*** | (2006.01) |
| ***C08K 5/101*** | (2006.01) |
| ***C08K 5/29*** | (2006.01) |
| ***C09J 5/06*** | (2006.01) |
| ***C09J 11/06*** | (2006.01) |
| ***C09J 133/06*** | (2006.01) |
| ***H10K 50/844*** | (2023.01) |
| ***H10K 77/10*** | (2023.01) |
| *G02F 1/01* | (2006.01) |
| *H10K 85/10* | (2023.01) |

(52) U.S. Cl.

CPC ........... *C09J 133/066* (2013.01); *C08F 20/06* (2013.01); *C08K 5/101* (2013.01); *C08K 5/29* (2013.01); *C09J 5/06* (2013.01); *C09J 11/06* (2013.01); *C09J 133/08* (2013.01); *H10K 50/8445* (2023.02); *H10K 77/111* (2023.02); *G02F 1/01* (2013.01); *H10K 85/10* (2023.02); *Y10T 428/2891* (2015.01); *Y10T 428/31* (2015.01)

(58) Field of Classification Search

None

See application file for complete search history.

(56) References Cited

U.S. PATENT DOCUMENTS

| | | | | |
|---|---|---|---|---|
| 10,353,126 B2 | 7/2019 | Park et al. | | |
| 10,586,941 B2 | 3/2020 | Lee et al. | | |
| 10,619,943 B2 | 4/2020 | Lee et al. | | |
| 11,280,558 B2 | 3/2022 | Lee et al. | | |
| 11,404,655 B2 | 8/2022 | Choi et al. | | |
| 11,430,963 B2 | 8/2022 | Park et al. | | |
| 11,535,777 B2 | 12/2022 | Uchida et al. | | |
| 11,732,080 B2 | 8/2023 | Schmatloch et al. | | |
| 11,844,265 B2 | 12/2023 | Park et al. | | |
| 12,077,693 B2 | 9/2024 | Park et al. | | |
| 12,302,742 B2 | 5/2025 | Park et al. | | |
| 2016/0122599 A1 * | 5/2016 | Kim | ..................... | C09J 133/066 428/354 |
| 2018/0120486 A1 | 5/2018 | Park et al. | | |
| 2020/0017722 A1 | 1/2020 | Uchida et al. | | |
| 2022/0177735 A1 | 6/2022 | Kim et al. | | |
| 2022/0298385 A1 | 9/2022 | Kim et al. | | |

FOREIGN PATENT DOCUMENTS

| | | | | |
|---|---|---|---|---|
| CN | 110891995 A | 3/2020 | | |
| CN | 111583788 A | 8/2020 | | |
| CN | 108008480 B | 11/2020 | | |
| CN | 110461972 B | 4/2022 | | |
| CN | 106960849 B | 4/2023 | | |
| JP | 2014-084386 A | 5/2014 | | |
| JP | 2019-173003 A | 10/2019 | | |
| KR | 20130001894 A * | 1/2013 | ................ | C09J 4/00 |
| KR | 10-2013-0099422 A | 9/2013 | | |
| KR | 10-2016-0053736 | 5/2016 | | |
| KR | 10-2017-0097856 A | 8/2017 | | |
| KR | 10-2018-0059653 A | 6/2018 | | |
| KR | 10-2019-0030912 | 3/2019 | | |
| KR | 10-2019-0069333 A | 6/2019 | | |
| KR | 10-2019-0090108 | 8/2019 | | |
| KR | 10-2019-0115157 | 10/2019 | | |
| KR | 10-2069481 | 1/2020 | | |
| KR | 10-2074070 | 2/2020 | | |
| KR | 10-2020-0101574 A | 8/2020 | | |
| WO | 2018173896 A1 | 9/2018 | | |

OTHER PUBLICATIONS

Junki Kim et al., English translation of KR 10-2013-0001894, Jan. 7, 2013 (Year: 2013).*

Compound summary of "Ethylene glycol diacrylate" from PubChem. (Year: 2025).*

Office Action dated Jul. 8, 2025 in related Chinese Patent Application No. 202111213961.7, 8 pages, in Chinese.

Notice of Allowance issued in corresponding Korean application No. KR 10-2020-0151945 on Jul. 24, 2026.

* cited by examiner

*Primary Examiner* — Anish P Desai

(74) *Attorney, Agent, or Firm* — F. CHAU & ASSOCIATES, LLC

(57) ABSTRACT

An adhesive composition includes an acrylic monomer, and a crosslinking agent. A storage modulus of the adhesive composition after curing the adhesive composition at a temperature of about −20° C. divided by a storage modulus of the adhesive composition after curing the adhesive composition at a temperature of about 60° C. is be greater than about 1 and less than about 10.

10 Claims, 15 Drawing Sheets

ADHESIVE AND DISPLAY DEVICE

CROSS-REFERENCE TO RELATED APPLICATION(S)

This is a divisional application of U.S. patent application Ser. No. 17/411,758 filed Aug. 25, 2021 (now U.S. U.S. Pat. No. 11,965,118 issued Apr. 23, 2024), the disclosure of which is incorporated herein by reference in its entirety. U.S. patent application Ser. No. 17/411,758 claims priority to and benefits of Korean Patent Application No. 10-2020-0151945 under 35 U.S.C. § 119, filed on Nov. 13, 2020 in the Korean Intellectual Property Office, the entire contents of which are incorporated herein by reference.

BACKGROUND

1. Technical Field

The disclosure relates to an adhesive composition and a display device.

2. Description of the Related Art

Electronic devices providing images to users, such as a smartphone, a tablet PC, a digital camera, a laptop computer, a navigation device, and a smart television, include display devices for displaying images. Recently, foldable display devices have attracted much attention. Since foldable display devices have wide screens with good portability, they have advantages of both smartphones and tablet PCs.

In foldable display devices, multiple laminated structures are laminated and bonded, and a bonding member is used between the laminated structures. The bonding member may serve to bond the laminated structures to each other and to protect the laminated structures of the display device from external impacts. Accordingly, the bonding member requires impact resistance in order to protect the laminated structures of the display device from external impacts.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an adhesive composition that has low viscosity and low temperature dependence and improves impact resistance, and a display device using the same.

However, aspects of the disclosure are not restricted to the one set forth herein. The above and other aspects of the disclosure will become more apparent to one of ordinary skill in the art to which the disclosure pertains by referencing the detailed description of the disclosure given below.

The adhesive composition and the display device according to the embodiments are capable of easily removing stress caused by temperature changes since the storage modulus of the bonding member produced using the adhesive composition has a small variation depending on temperature.

The bonding member produced using the adhesive composition according to the embodiment maintains the rigidity to withstand deformation upon application of an impact and absorbs the applied impact, thereby improving impact resistance. The adhesive composition according to the embodiment may be easily applied using inkjet printing due to the low viscosity thereof.

It should be noted that the effects of the disclosure are not limited to those described above, and other effects of the disclosure will be apparent from the following description. According to an embodiment of the disclosure, the adhesive composition may comprise an acrylic monomer, and a crosslinking agent. A storage modulus of the adhesive composition after curing the adhesive composition at a temperature of about −20° C. divided by a storage modulus of the adhesive composition after curing the adhesive composition at a temperature of about 60° C. may be greater than about 1 and less than about 10.

In an embodiment, the acrylic monomer may include at least one of n-hexyl acrylate (n-HA), 2-ethylhexyl acrylate (2-EHA), 2-hydroxyethyl acrylate (2-HEA), 4-hydroxybutyl acrylate (4-HBA), and dihydroxyhexyl acrylate (DHHA).

In an embodiment, the crosslinking agent may include at least one of ethylene diacrylate (EDA) and 3,3,5-trimethyl-5-(isocyanatomethyl)cyclohexyl isocyanate (IPDI).

In an embodiment, the adhesive composition may have a viscosity of about 10 cp to about 40 cp.

In an embodiment, after curing the adhesive composition, the storage modulus of the adhesive composition at a temperature of about −20° C. may be in a range of about 0.09 MPa to about 0.3 MPa.

In an embodiment, after curing the adhesive composition, the storage modulus of the adhesive composition at a temperature range of about −10° C. to about 60° C. may be in a range of about 104 Pa to about 107 Pa.

In an embodiment, after curing the adhesive composition, a ratio of a loss modulus of the adhesive composition to a storage modulus of the adhesive composition at a frequency range of about 1 kHz to about 100 kHz may be in a range of about 1.4 to about 1.9.

In an embodiment, after curing the adhesive composition, a storage modulus of the adhesive composition at a frequency range of 1 kHz to 100 kHz may be in a range from about 0.7 MPa to about 8 MPa.

According to an embodiment of the disclosure, the display device may comprise a display panel including a surface disposed on a front side, and a front laminated structure disposed on the one surface of the display panel. The front laminated structure may include at least one cover window and at least one bonding member. The at least one bonding member may include a window bonding member that attaches the cover window. A storage modulus of the window bonding member measured at a temperature of about −20° C. divided by a storage modulus of the window bonding member, measured at a temperature of about 60° C. may be greater than about 1 and less than about 10.

In an embodiment, the storage modulus of the window bonding member at a temperature of about −20° C. may be in a range of about 0.09 MPa to about 0.3 MPa.

In an embodiment, the storage modulus of the window bonding member measured in a temperature range of about −10° C. to about 60° C. may be in a range of about 104 Pa to about 107 Pa.

In an embodiment, a ratio of a loss modulus of the window bonding member to a storage modulus of the window bonding member in a frequency range of about 1 kHz to about 100 kHz may be in a range from about 1.4 to about 1.9.

In an embodiment, a storage modulus of the window bonding member at a frequency range of 1 kHz to 100 kHz may be in a range from about 0.7 MPa to about 8 MPa.

In an embodiment, the storage modulus of the window bonding member and the loss modulus of the window bonding member may be measured by a rheometer in a thin film state.

In an embodiment, the front laminated structure may include a polarization member disposed between the display panel and the cover window, and a polarization portion bonding member that attaches the polarization member to the first surface of the display panel.

In an embodiment, the front laminated structure may include an impact absorbing layer disposed between the polarization member and the cover window, and an impact absorbing layer bonding member that attaches the impact absorbing layer to the polarization member.

In an embodiment, the display panel may include a second surface disposed on a rear side. The display device may include a rear laminated structure disposed on the second surface of the display panel. The rear laminated structure may include a polymer film layer disposed below the display panel, a cushion layer disposed below the polymer film layer, a plate disposed below the cushion layer, and a heat dissipation member disposed behind the plate.

In an embodiment, the at least one bonding member attaches the polymer film layer, the cushion layer, the plate, and the heat dissipation member.

In an embodiment, the cover window may include an ultra-thin glass, and the window bonding member attaches the ultra-thin glass to the display panel.

In an embodiment, the display panel displays a screen on the front side.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
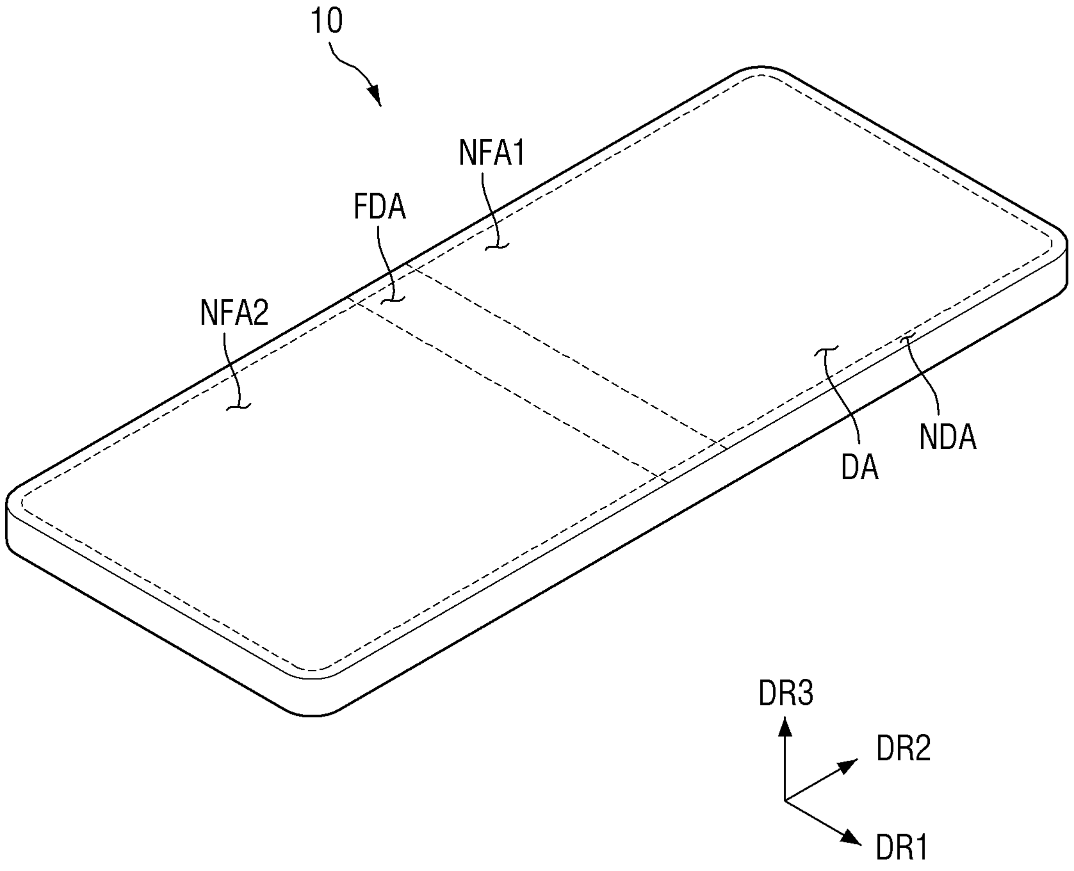
FIG. 1 is a schematic perspective view illustrating a display device in an unfolded state according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the embodiments. Similarly, the second element could also be termed the first element.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", "behind", "in front of" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Each of the features of the various embodiments of the disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

Figure 2:
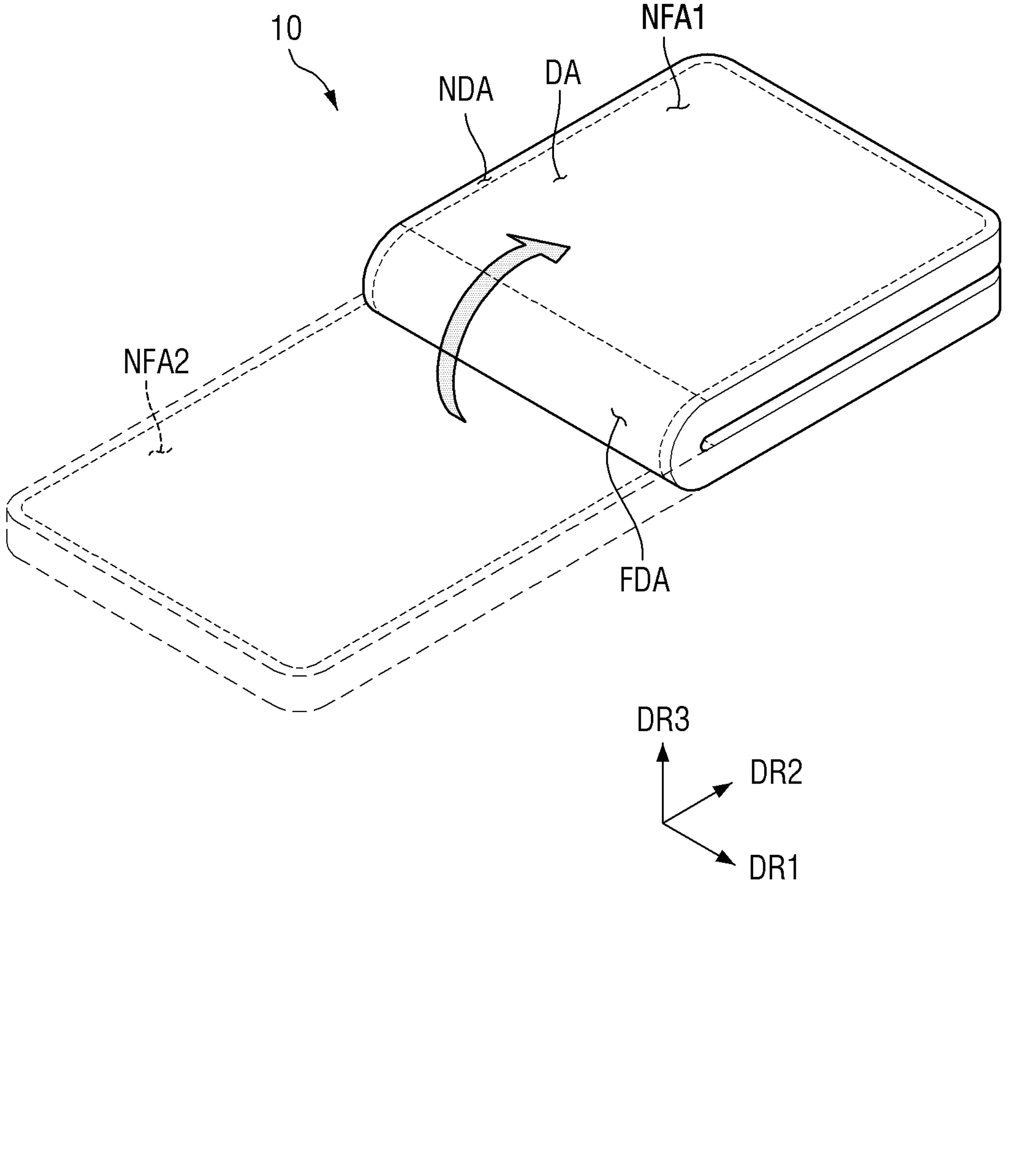
FIG. 2 is a schematic perspective view illustrating a display device in a folded state according to an embodiment.

FIG. 1 is a schematic perspective view illustrating a display device in an unfolded state according to an embodiment. FIG. 2 is a schematic perspective view illustrating a display device in a folded state according to an embodiment.

Referring to FIG. 1, a display device 10 according to an embodiment may be a foldable display device. Examples of display device 10 include smartphones, but the embodiments are not limited thereto. For example, the display device 10 may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator or a washing machine, or an Internet-of-Things device. Hereinafter, embodiments will be described in detail with reference to the accompanying drawings.

In FIGS. 1 and 2, a first direction DR1 may be a direction parallel to one side of the display device 10 in a plan view and may be, for example, a horizontal direction of the display device 10. A second direction DR2 may be a direction parallel to the other side of the display device 1 in a plan view and may be, for example, a vertical direction of the display device 10. A third direction DR3 may be a thickness direction of the display device 10.

In an embodiment, the display device 10 may have a rectangular shape in a plan view. The display device 10 may have a rectangular shape with right-angled or rounded corners in a plan view. The display device 10 may include two short sides arranged in the first direction DR1 and two long sides arranged in the second direction DR2 in a plan view.

The display device 10 includes a display area DA and a non-display area NDA. In a plan view, the shape of the display area DA may correspond to the shape of the display device 10. For example, when the display device 10 has a rectangular shape in a plan view, the display area DA may also have a rectangular shape.

The display area DA may be an area including pixels to display an image. The pixels may be arranged in a matrix. The pixels may have a rectangular, rhombic, or square shape in a plan view, without being limited thereto. For example, the pixels may have a quadrilateral shape other than a rectangular, rhombic, or square shape, a polygonal shape other than a quadrilateral shape, a circular shape, or an elliptical shape.

The non-display area NDA may be an area that does not include pixels and does not display an image. The non-display area NDA may be disposed around the display area DA.

The non-display area NDA may be disposed to surround the display area DA as shown in FIGS. 1 and 2, but the embodiments are not limited thereto. The display area DA may be partially surrounded by the non-display area NDA.

In an embodiment, the display device 10 may maintain both a folded state and an unfolded state. As shown in FIG. 2, the display device 10 may be folded in an in-folding manner in which the display area DA is disposed on the inside thereof. When the display device 10 is folded in an in-folding manner, the top surfaces of the display device 10 may be disposed to face each other. As another example, the display device 10 may be folded in an out-folding manner in which the display area DA is disposed on the outside thereof. When the display device 10 is folded in an out-folding manner, the bottom surfaces of the display device 10 may be disposed to face each other.

In an embodiment, the display device 10 may be a foldable device. As used herein, the term "foldable device" refers to a device which can be folded and is used to mean not only a folded device but also a device that can have both a folded state and an unfolded state. Further, the folding may typically include folding at an angle of about 180 degrees. However, the embodiments are not limited thereto, and may include devices where the folding angle exceeds 180 degrees or is less than 180 degrees, for example, the folding angle may be equal to or greater than 90 degrees and less than 180 degrees, or the folding angle is equal to or greater than 120 degrees and less than 180 degrees. A device may be in a folded state if folding is performed out of the unfolded state, even if the device folding is not completely folded. For example, even if the device is folded at an angle of 90 degrees or less, as long as the maximum folding angle becomes 90 degrees or more, it may be expressed as being in a folded state to distinguish it from the unfolded state. During the folding, the radius of curvature may be about 5 mm or less, for example in the range of about 1 mm to about 2 mm, or about 1.5 mm, but the embodiments are not limited thereto.

In an embodiment, the display device 10 may include a folding area FDA, a first non-folding area NFA1, and a second non-folding area NFA2. The folding area FDA may be an area in which the display device 10 is folded, and the first and second non-folding areas NFA1 and NFA2 may be areas in which the display device 10 is not folded.

The first non-folding area NFA1 may be disposed on a side (e.g., an upper side) of the folding area FDA. The second non-folding area NFA2 may be disposed on the other side (e.g., a lower side) of the folding area FDA. The folding area FDA may be an area bent with a curvature.

In an embodiment, the folding area FDA of the display device 10 may be determined at a specific location. One or more folding areas FDA may be determined at a specific location(s) in the display device 10. In other examples, the location of the folding area FDA may not be specified in the display device 10 and may be freely set in various areas.

In an embodiment, the display device 10 may be folded in the second direction DR2. Accordingly, the length of the display device 10 in the second direction DR2 may be reduced to approximately half, so that a user may conveniently carry the display device 10.

In an embodiment, the direction in which the display device 10 is folded is not limited to the second direction DR2. For example, the display device 10 may be folded in the first direction DR1. The length of the display device 10 in the first direction DR1 may be reduced to approximately half.

FIGS. 1 and 2 illustrate that each of the display area DA and the non-display area NDA overlaps the folding area FDA, the first non-folding area NFA1, and the second non-folding area NFA2, but the embodiments are not limited thereto. For example, each of the display area DA and the non-display area NDA may overlap at least one of the folding area FDA, the first non-folding area NFA1, and the second non-folding area NFA2.

Figure 3:
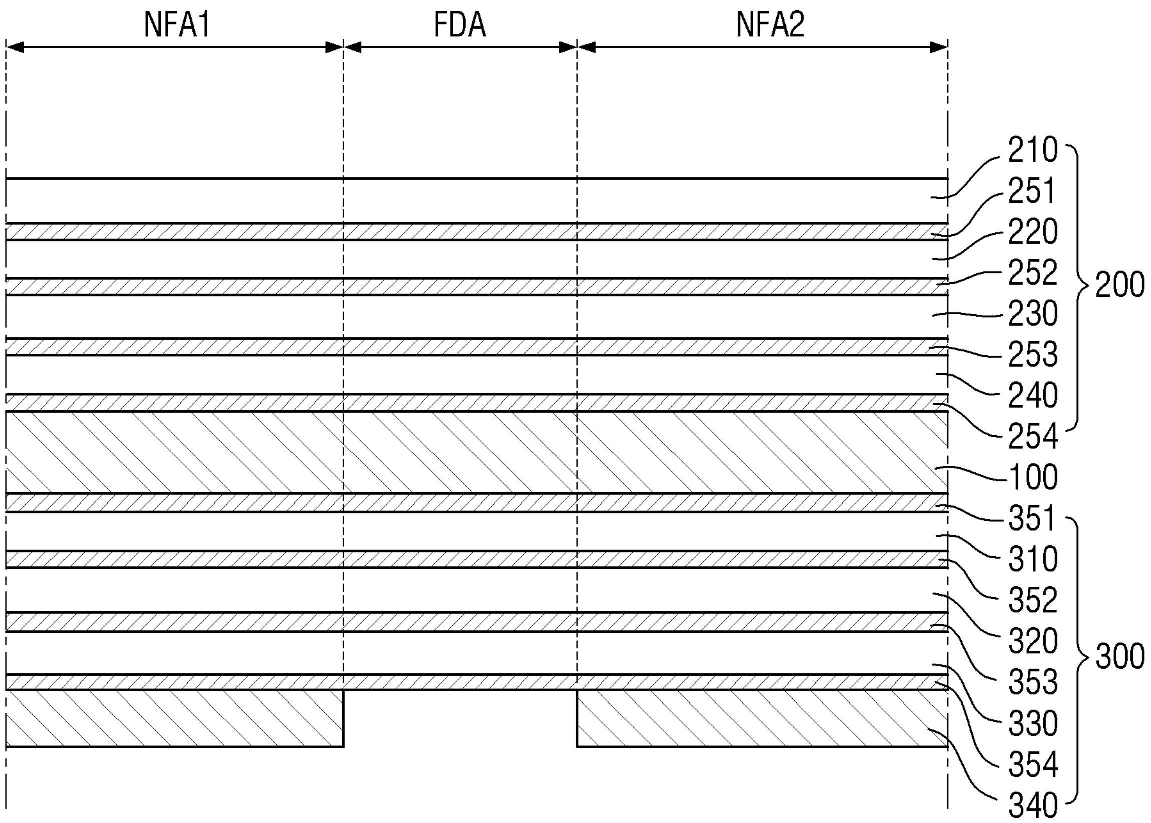
FIG. 3 is a schematic cross-sectional view of a display device in an unfolded state according to an embodiment.
Figure 4:
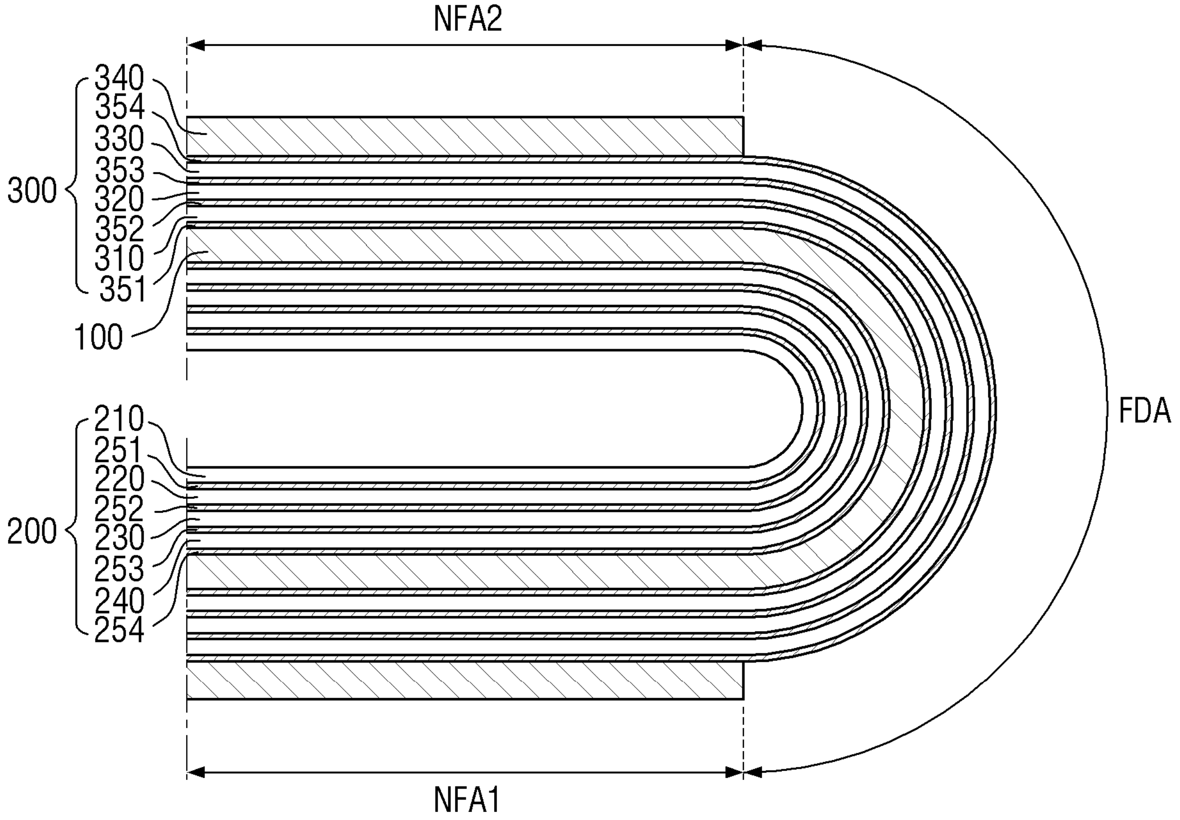
FIG. 4 is a schematic cross-sectional view of a display device in a folded state according to an embodiment.

FIG. 3 is a schematic cross-sectional view of a display device in an unfolded state according to an embodiment. FIG. 4 is a schematic cross-sectional view of a display device in a folded state according to an embodiment.

Referring to FIGS. 3 and 4, the display device 10 may include a display panel 100, a front laminated structure 200 on the front side of the display panel 100, and a rear laminated structure 300 on the rear side of the display panel 100. Each of the laminated structures 200 and 300 may include at least one bonding member 251 to 254 or 351 to 354. Here, the front side of the display panel 100 refers to a side on which the display panel 100 displays a screen, and the rear side refers to the opposite side of the front side. A first surface of the display panel 100 is located on the front side, and a second surface of the display panel 100 is located on the rear side.

The display panel 100 is a panel for displaying a screen or an image. Examples of the display panel 100 may include not only a self-light emitting display panel such as an organic light emitting display (OLED) panel, an inorganic electroluminescence (EL) display panel, a quantum dot light emitting display (QED) panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel. Hereinafter, an organic light emitting display panel will be described as an example of the display panel 100, and the organic light emitting display panel applied to the embodiment will be simply referred to as the display panel 100 unless special distinction is required. However, the embodiment is not limited to organic light emitting display panels, and other display panels may be applied within the scope of the embodiments.

The display panel 100 may further include a touch member. The touch member may be provided as a panel or film separate from the display panel 100 and attached onto the display panel 100, but may also be provided in the form of a touch layer inside the display panel 100. In the following embodiment, a case where the touch member is provided inside the display panel 100 and included in the display panel 100 is illustrated, but the embodiments are not limited thereto.

Figure 5:
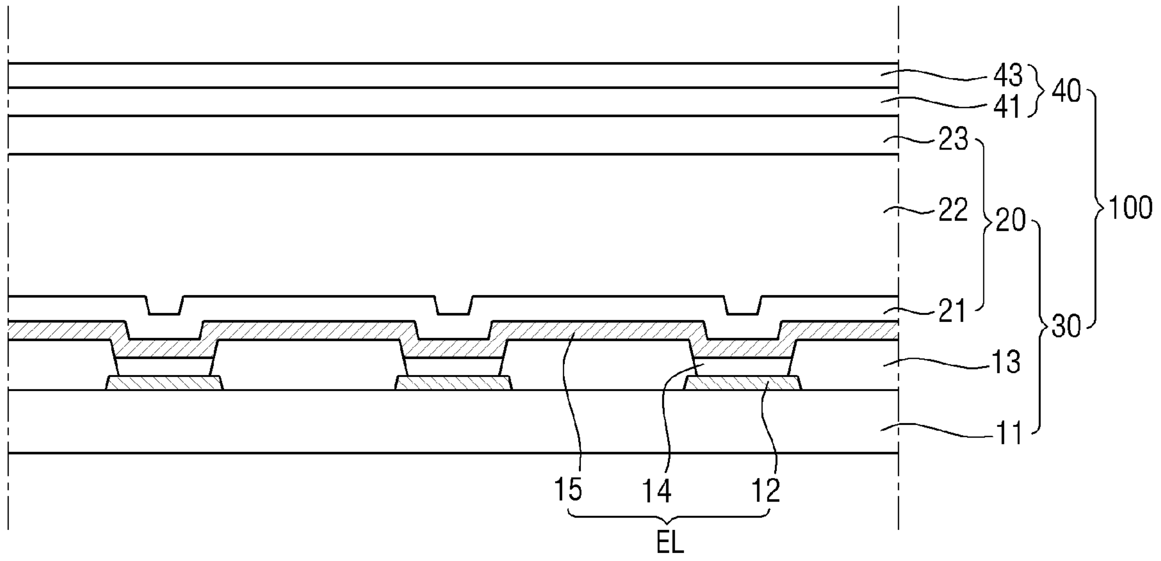
FIG. 5 is a schematic cross-sectional view of a display panel according to an embodiment.

FIG. 5 is a schematic cross-sectional view of a display panel according to an embodiment.

Referring to FIG. 5, the display device 10 according to an embodiment may include the display panel 100. The display panel 100 may include a base substrate 11, a first electrode 12, a pixel defining layer 13, a light emitting layer 14, a second electrode 15 and an encapsulation layer 20.

The base substrate 11 may be an insulating substrate. The base substrate 11 may be flexible, and may include a polymer material having flexibility. Here, the polymer material may be polyimide (PI), polyethersulphone (PES), polyacrylate (PA), polyarylate (PAR), polyetherimide (PEI), polyethylenenaphthalate (PEN), polyethyleneterephthalate (PET), polyphenylenesulfide (PPS), polyallylate, polycarbonate (PC), cellulosetriacetate (CAT), cellulose acetate propionate (CAP), or a combination thereof.

The first electrode 12 may be disposed on the base substrate 11. In an embodiment, the first electrode 12 may be an anode electrode. Although not shown in the drawing, other components may be further disposed between the base substrate 11 and the first electrode 12. For example, a buffer layer, a conductive wires, an insulating layer, and thin film transistors may be disposed between the base substrate 11 and the first electrode 12.

The pixel defining layer 13 may be disposed on the first electrode 12. The pixel defining layer 13 may include an opening exposing at least a portion of the first electrode 12.

The light emitting layer 14 may be disposed on the first electrode 12. In an embodiment, the light emitting layer 14 may emit red light, green light, or blue light. The wavelength of red light may be about 620 nm to about 750 nm, and the wavelength of green light may be about 495 nm to about 570 nm. The wavelength of blue light may be about 450 nm to about 495 nm. The light emitting layer 14 may be formed of a single layer. Alternatively, the light emitting layer 14 may have a structure in which multiple organic light emitting layers are laminated, for example, in a tandem structure. In other examples, the light emitting layer 14 may emit white light. When the light emitting layer 14 emits white light, the light emitting layer 14 may have a red organic light emitting layer, a green organic light emitting layer, and a blue organic light emitting layer which are laminated.

The second electrode 15 may be disposed on the light emitting layer 14 and the pixel defining layer 13. The second electrode 15 may be formed entirely on the light emitting layer 14 and the pixel defining layer 13 in an embodiment. In other examples, the second electrode 15 may be a cathode electrode.

The first electrode 12, the second electrode 15, and the light emitting layer 14 may constitute a light emitting element EL.

The encapsulation layer 20 may be positioned on the light emitting element EL. The encapsulation layer 20 may seal the light emitting element EL and prevent moisture or the like from entering the light emitting element EL from the outside.

In one embodiment, the encapsulation layer 20 may be implemented as a thin film encapsulation, and may include one or more organic films and one or more inorganic films. For example, the encapsulation layer 20 may include a first inorganic film 21 positioned on the second electrode 15, an organic film 22 positioned on the first inorganic film 21, and a second inorganic film 23 positioned on the organic film 22.

The first inorganic film 21 may prevent moisture, oxygen, or the like from infiltrating into the light emitting element EL. The first inorganic film 21 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or the like.

The organic film 22 may be positioned on the first inorganic film 21. The organic film 22 may improve flatness.

The organic film 22 may be formed of a liquid organic material, for example, acrylic resin, methacrylic resin, polyisoprene, vinyl resin, epoxy resin, urethane resin, cellulose resin and perylene resin, or the like. The organic material may be provided on the base substrate 11 through vapor deposition, printing, and coating, and may be subjected to a curing process.

The second inorganic film 23 may be positioned on the organic film 22. The second inorganic film 23 may perform substantially the same or similar function to the first inorganic film 21, and may be made of a material substantially the same or similar to the first inorganic film 21. The second inorganic film 23 may completely cover the organic film 22. In some embodiments, the second inorganic film 23 and the first inorganic film 21 may contact each other in the non-display area NDA to form an inorganic-inorganic junction. However, the structure of the encapsulation layer 20 is not limited thereto, and the laminated structure of the encapsulation layer 20 may be changed. In other examples, the encapsulation layer 20 may be formed of a glass substrate or the like.

The touch sensor 40 may be disposed on the encapsulation layer 20. In an embodiment, the touch sensor 40 may be located directly on the encapsulation layer 20. For example, the encapsulation layer 20 may function as a base portion of the touch sensor 40.

The touch sensor 40 may include a touch element layer 41 and a protective layer 43. The touch element layer 41 may include a touch electrode and touch signal lines connected to the touch electrode. In an embodiment, the touch electrode may include metal, and may have a mesh shape. For example, the touch electrode may be formed of a metal mesh pattern, thereby improving flexibility of the touch element layer 41.

The protective layer 43 may be positioned on the touch element layer 41 to protect the touch element layer 41. In an embodiment, the protective layer 43 may include an organic material, and may be made of, for example, an acrylic polymer. When the protective layer 43 is made of an organic material, flexibility of the touch sensor 40 may be improved.

Referring back to FIGS. 3 and 4, the front laminated structure 200 may be disposed on the front side of the display panel 100. The front laminated structure 200 may include a polarization member 240, an impact absorbing layer 230, a cover window 220, and a cover window protective layer 210, which are sequentially laminated forward from the display panel 100.

The polarization member 240 may polarize light passing through and may reduce the reflection of external light. In an embodiment, the polarization member 240 may be a polarizing film. The polarizing film may include a polarizing layer and protective members sandwiching the polarizing layer. The polarizing layer may include a polyvinyl alcohol film. The polarizing layer may be stretched in one direction. The stretching direction of the polarizing layer may be an absorption axis, and the perpendicular direction may be a transmission axis. The protective members may be disposed on one surface and the other surface of the polarizing layer, respectively. The protective member may be made of cellulose resin such as triacetyl cellulose, polyester resin, or the like, but the embodiments are not limited thereto.

The impact absorbing layer 230 may be disposed on the front side of the polarization member 240. The impact absorbing layer 230 may serve to protect a structure such as a lower display panel from external impact. In an embodiment, the impact absorbing layer 230 may be a polymer film. The polymer film may include, for example, at least one of polyethylene terephthalate (PET), polyethylene naphthalate (PEN), polyether sulfone (PES), polyimide (PI), polyarylate (PAR), polycarbonate (PC), polymethyl methacrylate (PMMA), and cycloolefin copolymer (COC).

The cover window 220 may be disposed on the front side of the impact absorbing layer 230. The cover window 220 serves to protect the display panel 100. The cover window 220 may be made of a transparent material. The cover window 220 may include, for example, glass or plastic.

When the cover window 220 includes glass, the glass may be ultra-thin glass (UTG) or thin glass. The ultra-thin glass UTG may be strengthened to have a stress profile. The strengthened ultra-thin glass UTG more efficiently prevents generation of cracks, propagation of cracks, breakage and the like due to external impact than before strengthening. The ultra-thin glass UTG strengthened by a strengthening process may have a different stress profiles for each region.

When the glass is ultra-thin glass or thin glass, it may have a flexible property so that it can be curved, bent, folded, or rolled. The thickness of the glass may be, for example, in the range of about 10 μm to about 300 μm, about 10 μm to about 100 μm, or about 50 μm. The glass of the cover window 220 may include soda-lime glass, alkali aluminosilicate glass, borosilicate glass, or lithium alumina silicate glass. The glass of the cover window 220 may include chemically strengthened or thermally strengthened glass to have strong rigidity. Chemical strengthening may be achieved through an ion exchange process in alkaline salts. The ion exchange process may be performed two or more times. In other examples, the cover window 220 may be obtained by coating glass thin films on both surfaces of the polymer film.

Referring again to FIGS. 3 and 4, when the cover window 220 includes plastic, it may be more advantageous in exhibiting a flexible property such as folding. Examples of plastics applicable to the cover window 220 may include, but are not limited to, polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyarylate (PAR), triacetyl cellulose (TAC), and cellulose acetate propionate (CAP). The plastic cover window 220 may include one or more of the plastic materials mentioned above.

The cover window protection layer 210 may be disposed on the front side of the cover window 220. The cover window protection layer 210 may perform at least one of functions of prevention of scattering, impact absorption, prevention of scratch, prevention of fingerprint smudges and prevention of glare on the cover window 220. The cover window protection layer 210 may include a transparent polymer film. The transparent polymer film includes at least one of polyethylene terephthalate (PET), polyethylene naphthalate (PEN), polyether sulfone (PES), polyimide (PI), polyarylate (PAR), polycarbonate (PC), polymethyl methacrylate (PMMA), or cycloolefin copolymer (COC).

The front laminated structure 200 may include front bonding members 251 to 254 for bonding adjacent laminated members. For example, a first bonding member 251 may be disposed between the cover window 220 and the cover window protective layer 210 to couple (or connect) them, a second bonding member 252 may be disposed between the cover window 220 and the impact absorbing layer 230 to couple (or connect) them, a third bonding member 253 may be disposed between the impact absorbing layer 230 and the polarization member 240 to couple (or connect) them, and a fourth bonding member 254 may be disposed between the polarization member 240 and the display panel 100 to couple (or connect) them. For example, in the front bonding members 251 to 254 which are members for attaching the layers on one surface of the display panel 100, the first bonding member 251 may be a protection layer bonding member for attaching (or connecting) the cover window protective layer 210, the second bonding member 252 may be a window bonding member for attaching (or connecting) the cover window 220, the third bonding member 253 may be an impact absorbing layer bonding member for attaching (or connecting) the impact absorbing layer 230, and the fourth bonding member 254 may be a polarization portion bonding member for attaching (or connecting) the polarization member 240. The front bonding members 251 to 254 may be optically transparent.

The rear laminated structure 300 is disposed on the rear side of the display panel 100. The rear laminated structure 300 may include a polymer film layer 310, a cushion layer 320, and a plate 330, and a heat dissipation member 340, which are sequentially laminated rearward (or downward) from the display panel 100.

The polymer film layer 310 may include a polymer film. The polymer film layer 310 may include, for example, polyimide (PI), polyethylene terephthalate (PET), polycarbonate (PC), polyethylene (PE), polypropylene (PP), polysulfone (PSF), polymethylmethacrylate (PMMA), triacetylcellulose (TAC), cycloolefin polymer (COP) or the like. The polymer film layer 310 may include a functional layer on at least one surface. The functional layer may include, for example, a light absorbing layer. The light absorbing layer may include a light absorbing material such as a black pigment or dye. The light absorbing layer may be formed by coating or printing black ink on a polymer film.

The cushion layer 320 may be disposed on the rear side of (or below) the polymer film layer 310. The cushion layer 320 may absorb external impacts and prevent the display panel 100 from being damaged. The cushion layer 320 may be formed of a single layer or multiple laminated layers. The cushion layer 320 may include, for example, a material having elasticity such as polyurethane or polyethylene resin. In an embodiment, the cushion layer 320 may be made of a foam material similar to a sponge.

The plate 330 may be disposed on the rear side of (or below) the cushion layer 320. The plate 330 may be a support member for bonding the display device 10 to a case. The plate 330 may be made of a material having rigidity. In an embodiment, the plate 330 may be made of a single metal or metal alloy such as stainless steel (SUS).

The heat dissipation member 340 may be disposed on the rear side of (or below) the plate 330. The heat dissipation member 340 serves to diffuse heat generated from the display panel 100 or other parts of the display device 10. The heat dissipation member 340 may include a metal plate. The metal plate may include metal having thermal conductivity, such as copper or silver. The heat dissipation member 340 may be a heat dissipation sheet including graphite or carbon nanotubes.

Although not limited thereto, the heat dissipation member 340 may be separated by the folding area FDA to facilitate folding of the display device 10 as illustrated in FIGS. 3 and 4. For example, a first metal plate may be disposed in the first non-folding area NFA1, and a second metal plate may be disposed in the second non-folding area NFA2. The first metal plate and the second metal plate may be physically separated from each other with respect to the folding area FDA.

The rear laminated structure 300 may include rear bonding members 351 to 354 for bonding adjacent laminated members. For example, a fifth bonding member 351 may be disposed between the display panel 100 and the polymer film layer 310 to couple (or connect) them, a sixth bonding member 352 may be disposed between the polymer film layer 310 and the cushion layer 320 to couple (or connect) them, a seventh bonding member 353 may be disposed between the cushion layer 320 and the plate 330 to couple (or connect) them, and an eighth bonding member 354 may be disposed between the plate 330 and the heat dissipation member 340 to couple (or connect) them. For example, in the rear bonding members 351 to 354 which are members for attaching the layers on the other surface of the display panel 100, the fifth bonding member 351 may be a polymer film layer bonding member for attaching the polymer film layer 310, the sixth bonding member 352 may be a cushion layer bonding member for attaching the cushion layer 320, the seventh bonding member 353 may be a plate bonding member for attaching the plate 330, and the eighth bonding member 354 may be a heat dissipation portion bonding member for attaching the heat dissipation member 340. When the heat dissipation member 340 is separated with respect to the folding area FDA, the eighth bonding member 354 may also be separated in the same way, but may be continuous as illustrated in FIG. 3 without being separated for each of the non-folding areas NFA1 and NFA2.

When the display device 10 performs display only on the front surface, the rear bonding members 351 to 354 are not necessarily optically transparent, unlike the front bonding members 251 to 254.

Each of the front bonding members 251 to 254 and the rear bonding members 351 to 354 described above may include an adhesive material. Each bonding member may include an optical clear resin (OCR). The bonding members may have the same composition, or may have different compositions according to the positions thereof and targets to be bonded.

Each of the first to eighth bonding members 251 to 254 and 351 to 354 may have a thickness of 300 μm or less. In an embodiment, each of the bonding members 251 to 254 and 351 to 354 may have a thickness of about 200 μm or less, and at least some of the bonding members 251 to 254 and 351 to 354 may have a thickness of about 100 μm or less. The lower limit of the thickness of the bonding members 251 to 254 and 351 to 354 needs not to be fixed, but the thickness may be about 10 μm or more in order to secure a minimum adhesion. In an embodiment, each of the first to eighth bonding members 251 to 254 and 351 to 354 may have a thickness of about 25 to about 100 μm. Since each of the first to eighth bonding members 251 to 254 and 351 to 354 has the thickness of about 25 to about 100 μm, it is possible to prevent the occurrence of peeling between the components included in the display device when the display device is folded.

Each of the bonding members 251 to 254 and 351 to 354 may be formed of a single adhesive layer, or may be formed of a multilayer including multiple adhesive layers. Further, each of the bonding members 251 to 254 and 351 to 354 may include adhesive layers on both surfaces of the member, respectively, similar to a double-sided tape.

The display device described above may be a foldable display device, and the respective bonding members 251 to 254 and 351 to 354 may function to reduce the bending and stress of the display device. The bonding members 251 to 254 and 351 to 354 may have a low storage modulus in order to minimize stress when the display device is folded. The display device is provided with holes such as camera holes and optical sensor holes and the bonding members may have sufficient workability in order to punch these hole regions. For this purpose, a bonding member may be formed by applying an adhesive composition using an inkjet-printing method. Adhesives with high viscosity may be difficult to apply using inkjet printing. Adhesives with a high storage modulus may have difficulties due to the high stress during folding.

In an embodiment, a foldable display device may include an adhesive composition with low viscosity, low storage modulus and impact resistance may be suitable for the foldable display device.

At least one of the bonding members 251 to 254 or 351 to 354 may be formed of an adhesive composition. For example, the window bonding member, which is the second bonding member 252, may be formed of an adhesive composition described below. The adhesive composition may contain an acrylic monomer and a crosslinking agent.

The acrylic monomer may include at least one of n-hexyl acrylate (n-HA), 2-ethylhexyl acrylate (2-EHA), 2-hydroxyethyl acrylate (2-HEA), 4-hydroxybutyl acrylate (4-HBA), and dihydroxyhexyl acrylate (DHHA). Multiple acrylic monomers may be polymerized with one another to form an oligomer.

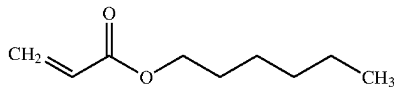

n-Hexyl acrylate (n-HA)

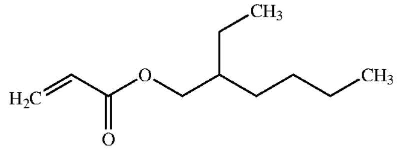

2-Ethylhexyl acrylate (2-EHA)

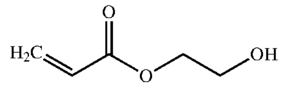

2-Hydroxyethyl acrylate (2-HEA)

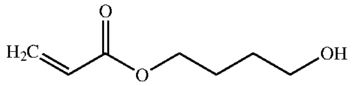

4-Hydroxybutyl acrylate (2-HBA)

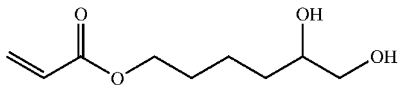

dihyroxyhexyl acrylate (DHHA)

The crosslinking agent may include at least one of ethylene diacrylate (EDA) and 3,3,5-trimethyl-5-(isocyanatomethyl)cyclohexyl isocyanate (IPDI).

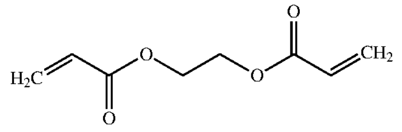

Ethylene diacrylate
(EDA)

-continued

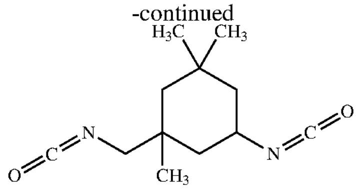

3,3,5-Trimethyl-5-(isocyanatomethyl) cyclohexyl isocyanate (IPDI)

The adhesive composition may have a minimized oligomer content and an increased monomer content in order to lower the viscosity. For this purpose, the adhesive composition may contain a monomer including a highly reactive hydroxyl group (—OH), and the ratio of the crosslinking agent may be controlled. The adhesive composition further contains a solvent, and may further contain an additive such as an adhesion promoter, a filler, or an antistatic agent.

The adhesive composition may be prepared, for example, by mixing about 120 parts by weight to about 250 parts by weight of an acrylic monomer with a solvent and heating while stirring, adding about 1.5 to about 2.5 parts by weight of a crosslinking agent and about 0.1 to about 1 parts by weight of an additive to the solution and heating while stirring.

The bonding member produced using the adhesive composition described above may satisfy Mathematical Expression 1 below.

$$1 < G'(-20° C.)/G'(60° C.) < 10$$ [Mathhmematical Expression 1]

In Mathematical Expression 1, G'(−20° C.) is the storage modulus of the bonding member after curing of the adhesive composition, measured at a temperature of about −20° C., and G'(60° C.) is the storage modulus of the bonding member after curing of the adhesive composition, measured at a temperature of about 60° C. G'(−20° C.) divided by G'(60° C.) may be greater than about 1 and less than about 10.

A bonding member suitable for a foldable display device should have a modulus with less dependence on temperature in order to remove stress depending on a temperature change. In an embodiment, the ratio of the storage modulus of the bonding member after curing of the adhesive composition measured at a temperature of about −20° C. to the storage modulus of the bonding member after curing of the adhesive composition at a temperature of about 60° C. may be 10 or less. A ratio of the storage modulus of the bonding member after curing of the adhesive composition measured at a temperature of −20° C. to the storage modulus of the bonding member after curing of the adhesive composition at a temperature of about 60° C., which is less than 10, means that the difference in the storage modulus of the bonding member after curing the adhesive composition at respective temperatures of about −20° C. and about 60° C. is small. In an embodiment, the storage modulus of the bonding member after curing of the adhesive composition, measured at a temperature of −20° C. may be in the range of about 0.09 MPa to about 0.3 MPa.

Figure 6:
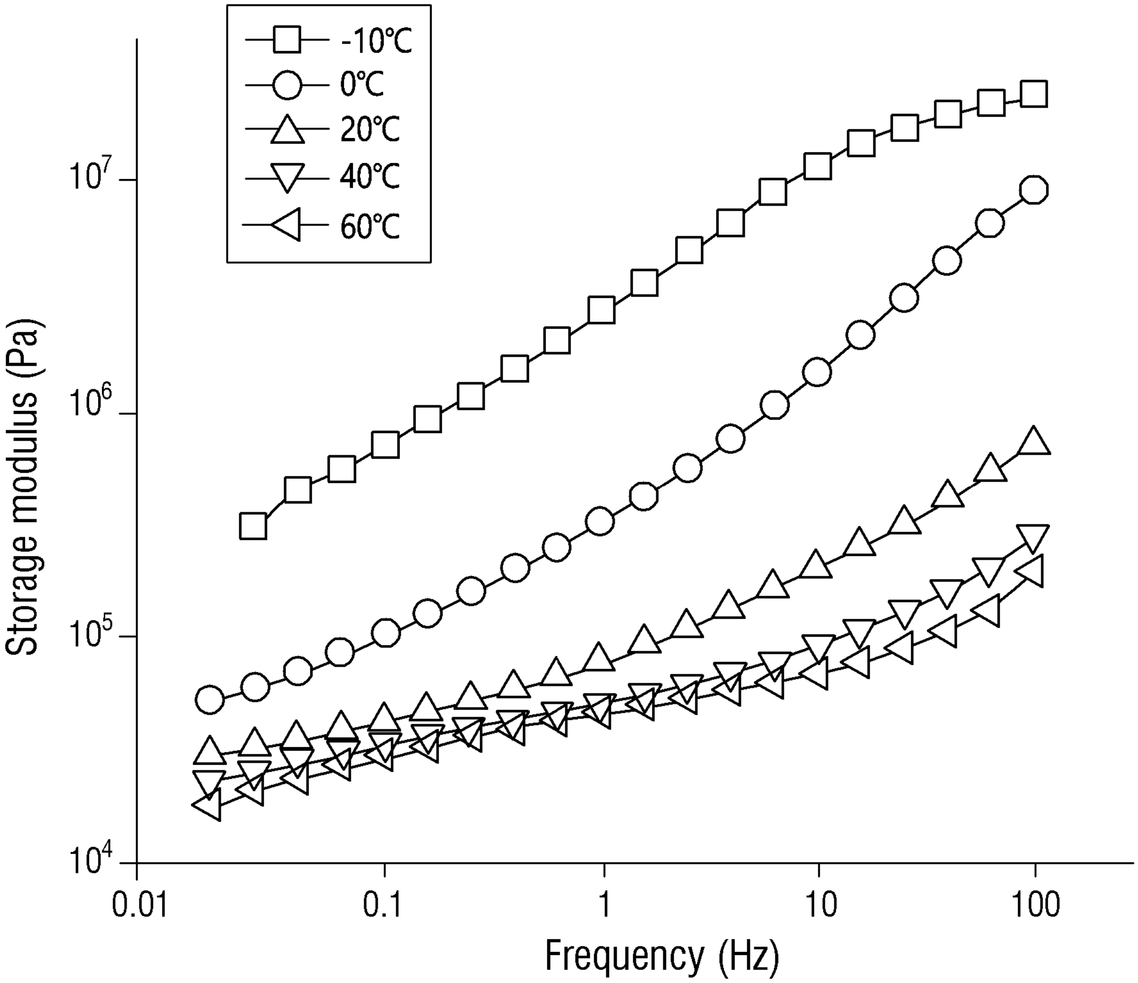
FIG. 6 is a graph showing the storage modulus of the bonding member according to frequency.
Figure 7:
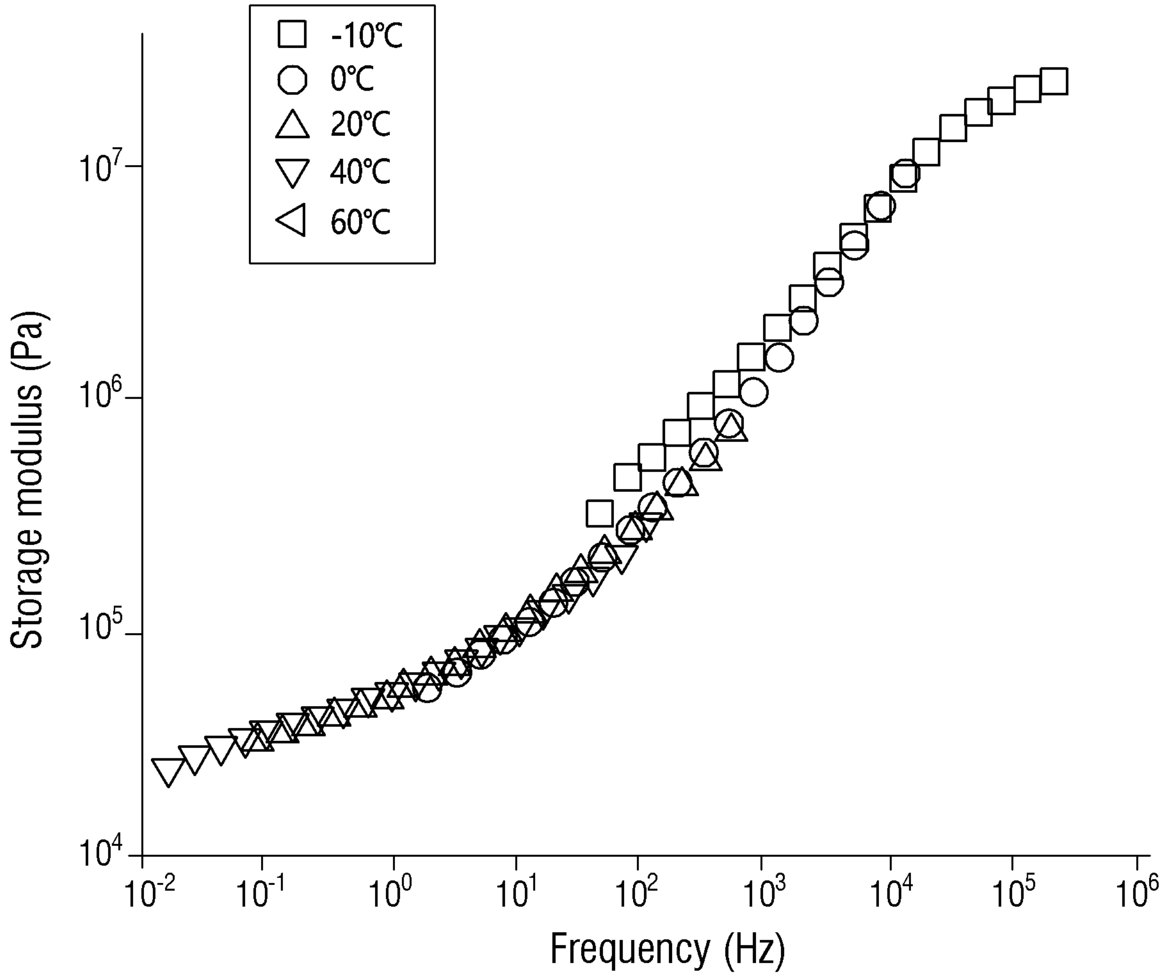
FIG. 7 is a graph showing the storage modulus of the bonding member converted by temperature time superposition (TTS)

FIG. 6 is a graph showing the storage modulus of the bonding member according to frequency. FIG. 7 is a graph showing the storage modulus of the bonding member converted by temperature time superposition (TTS).

The storage modulus of the bonding member produced using the adhesive composition may be measured using a rheometer such as DHR3 produced by TA Instruments. The rheometer is used to measure only the storage modulus at the frequency range of about $10^{-2}$ to about $10^{2}$ Hz. Accordingly, the storage modulus may be obtained at the entire frequency range of about $10^{-2}$ to about $10^{8}$ Hz by measuring the storage modulus at each temperature (about −40° C. to about 40° C.) and converting the storage modulus through temperature time superposition (TTS).

In an embodiment, the storage modulus of the bonding member after curing adhesive composition at the temperature range of about −10° C. to about 60° C. may be in the range of about 104 Pa to about 107 Pa. The bonding member according to the embodiment satisfies the requirement of Mathematical Expression 1, and the storage modulus does not vary greatly depending on temperature, and stress depending on temperature changes may be easily reduced.

The bonding member produced using the adhesive composition has viscoelasticity, and thus the physical properties change greatly in a frequency-dependent manner. The behavior of the bonding member upon application of impact may be related to physical properties at a high frequency because the impact time during which an external impact is applied is very short, on the order of milliseconds (ms). The bonding member according to an embodiment has a storage modulus of about 0.7 MPa to about 8 MPa at a frequency range of about 1 kHz to about 100 kHz, and thus can maintain rigidity to thereby withstand deformation upon application of impact. The bonding member after curing of the adhesive composition may have a ratio of a loss modulus to a storage modulus of about 1.4 to about 1.9. Accordingly, the bonding member may serve as a damping member to absorb the applied external impact. The bonding member according to an embodiment satisfies a storage modulus of about 0.7 MPa to about 8 MPa at a frequency range of 1 kHz to 100 kHz and a ratio of a loss modulus to a storage modulus of about 1.4 to about 1.9, thereby improving impact resistance.

The adhesive composition may have low viscosity in order to be applicable to inkjet printing. The adhesive composition has low viscosity of about 10 cp to about 40 cp and thus may be applied using inkjet printing.

Figure 8:
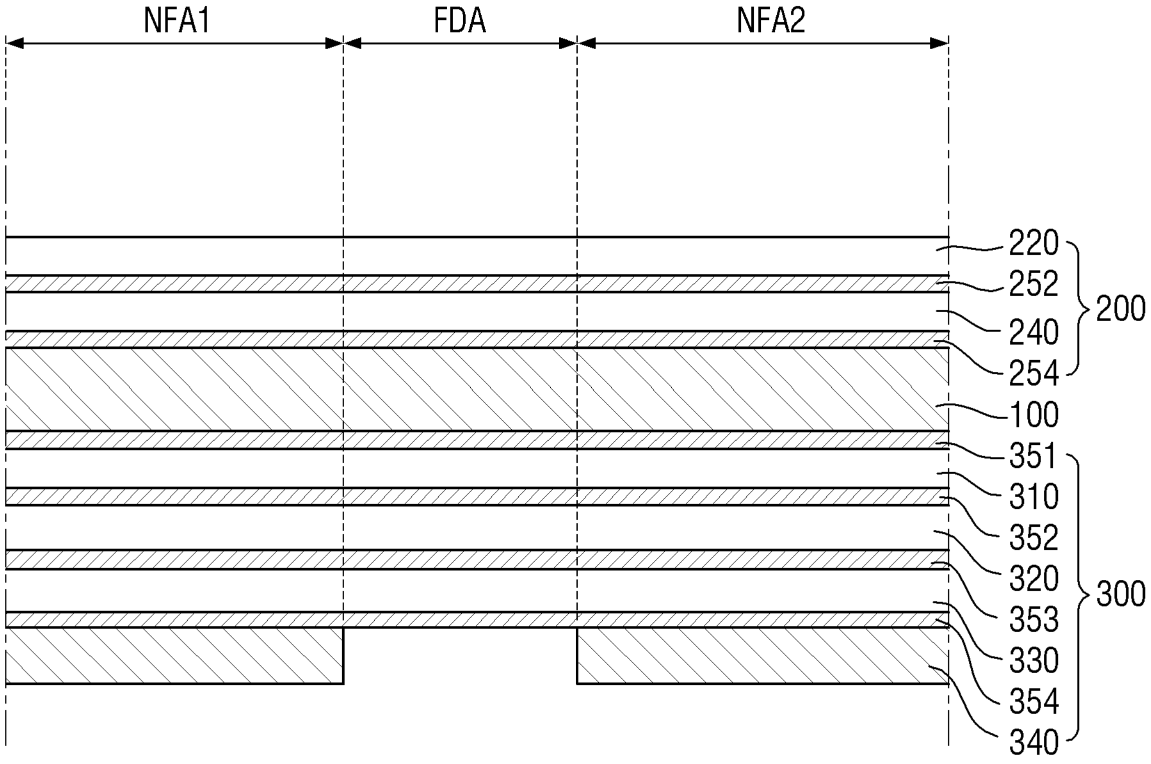
FIG. 8 is a schematic cross-sectional view of a display device according to an embodiment.
Figure 10:
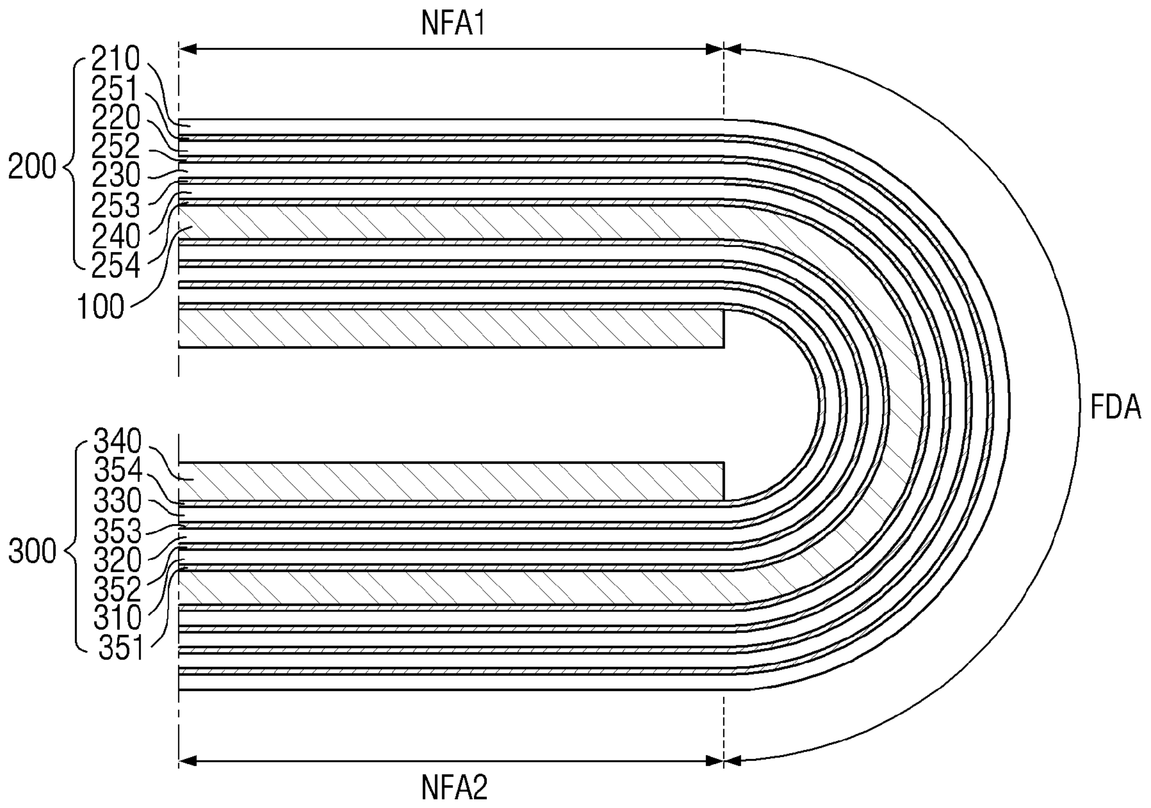
FIG. 10 is a schematic cross-sectional view of a display device according to an embodiment.

Hereinafter, other examples of embodiments will be described. FIGS. 8 and 10 illustrate that the display device may have various laminated structures.

Figure 9:
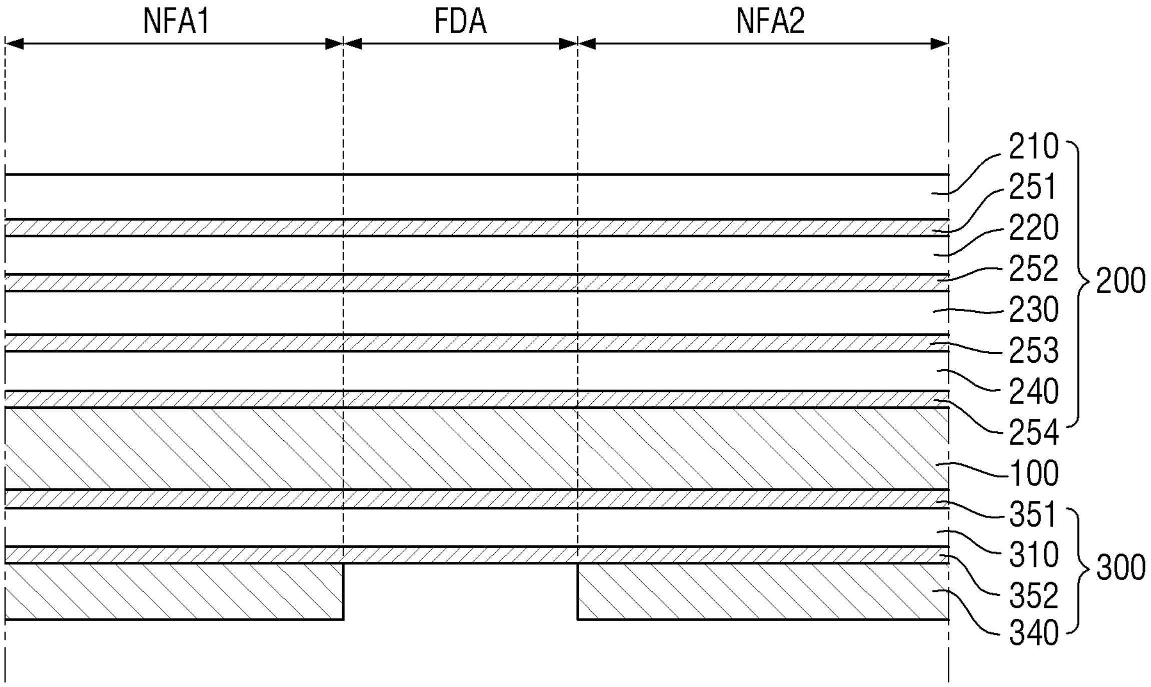
FIG. 9 is a schematic cross-sectional view of a display device according to an embodiment.

FIG. 8 is a schematic cross-sectional view of a display device according to an embodiment. FIG. 9 is a schematic cross-sectional view of a display device according to an embodiment, showing another example. FIG. 10 is a schematic cross-sectional view of a display device according to an embodiment, showing a third example.

Referring to FIG. 8, the display device 10 according to the embodiment is different from the embodiment of FIG. 3 in that the cover window protective layer 210, the first bonding member 251, the impact absorbing layer 230, and the third bonding member 253 may be omitted.

Referring to FIG. 9, the display device 10 according to the embodiment is different from the embodiment of FIG. 3 in that the buffer layer 320, the seventh bonding member 353, the plate 330, and the eighth bonding member 354 may be omitted. The configurations of the embodiment can be easily understood from those described with reference to FIG. 3, and such descriptions are not repeated.

Referring to FIG. 10, the display device 10 according to the embodiment is the same as the embodiment of FIG. 3 in the laminated structure, but is different from the embodiment of FIG. 3 in that the folding operation is performed in an out-folding manner in which the display surface faces outward.

As described above, when the display device 10 is folded in the out-folding manner, the front laminated structure 200 and the rear laminated structure 300 are stressed oppositely to those shown in FIG. 3. The front laminated structure 200 may be subjected to tensile stress, and the rear laminated structure 300 may be subjected to compressive stress.

Hereinafter, the embodiments will be described in more detail through fabrication examples and experimental examples.

Fabrication Example 1: Fabrication of Display Devices

Multiple display device samples having the laminated structure shown in FIG. 3 were fabricated.

Fabrication Example 2: Preparation of Adhesive 2-hydroxyethyl acrylate (2-HEA), 2-ethylhexyl acrylate (2-EHA) and n-hexyl acrylate (n-HA) as monomers, 3,3,5-trimethyl-5-(isocyanatomethyl)cyclohexyl isocyanate (IPDI) as a crosslinking agent and a small amount of adhesion promoter were mixed to prepare adhesive #1.

4-hydroxybutyl acrylate (4-HBA) and 2-ethylhexyl acrylate (2-EHA) as monomers, ethylene diacrylate (EDA) as a crosslinking agent and a small amount of adhesion promoter were mixed to prepare adhesive #2. At this time, the crosslinking agent and the 4-hydroxybutyl acrylate were mixed at a ratio of 0.9:0.7.

Adhesive #3 was prepared in the same manner as adhesive #2, except that the crosslinking agent and the 4-hydroxybutyl acrylate were mixed at a ratio of 0.9:0.9.

4-hydroxybutyl acrylate (4-HBA), 2-ethylhexyl acrylate (2-EHA) and n-hexyl acrylate (n-HA) as monomers, 3,3,5-trimethyl-5-(isocyanatomethyl)cyclohexyl isocyanate (IPDI) as a crosslinking agent, and a small amount of adhesion promoter were mixed to prepare adhesive #4. At this time, the crosslinking agent and the 4-hydroxybutyl acrylate were mixed at a ratio of 0.9:0.7.

4-hydroxybutyl acrylate (4-HBA), dihydroxyhexyl acrylate (DHHA) and 2-ethylhexyl acrylate (2-EHA) as monomers, ethylene diacrylate (EDA) as a crosslinking agent and a small amount of adhesion promoter were mixed to prepare adhesive #5.

Adhesive #6 was prepared in the same manner as adhesive #4 except that the crosslinking agent and the 4-hydroxybutyl acrylate were mixed at a ratio of 0.9:0.9.

Adhesive #7 was prepared in the same manner as adhesive #2 except that the crosslinking agent and the 4-hydroxybutyl acrylate were mixed at a ratio of 1.1:0.9.

4-hydroxybutyl acrylate (4-HBA) as a monomer, ethylene diacrylate (EDA) as a crosslinking agent, and a small amount of adhesion promoter were mixed to prepare adhesive #8.

4-hydroxybutyl acrylate (4-HBA), n-hexyl acrylate (n-HA) and tetrahydrofurfuryl acrylate (THFA) as monomers, ethylene diacrylate (EDA) and 3,3,5-trimethyl-5-(isocyanatomethyl)cyclohexyl isocyanate (IPDI) as crosslinking agents and a small amount of adhesion promoter were mixed to prepare adhesive #9.

2-hydroxyethyl acrylate (2-HEA) and n-hexyl acrylate (n-HA) as monomers, 3,3,5-trimethyl-5-(isocyanatomethyl)

cyclohexyl isocyanate (IPDI) as a crosslinking agent and a small amount of adhesion promoter were mixed to prepare adhesive #10.

4-hydroxybutyl acrylate (4-HBA), n-hexyl acrylate (n-HA) and 2-ethylhexyl acrylate (2-EHA) as monomers, ethylene diacrylate (EDA) and 3,3,5-trimethyl-5-(isocyanatomethyl)cyclohexyl isocyanate (IPDI) as crosslinking agents and a small amount of adhesion promoter were mixed to prepare adhesive #11.

4-hydroxybutyl acrylate (4-HBA) and 2-ethylhexyl acrylate (2-EHA) as monomers, ethylene diacrylate (EDA) as a crosslinking agent and a small amount of adhesion promoter were mixed to prepare adhesive #12.

Experimental Example 1: Storage Modulus Depending on Temperature

Adhesives #1 to #12 were coated to a thickness of 500 μm between release paper films, UV-cured, and then aged for 30 minutes. Then, the storage modulus of each sample was measured at −20° C. to 60° C. At this time, each adhesive sample and a PSA sample as a control were cut to a diameter of 8 mm and a thickness of 500 μm, and then the storage modulus depending on temperature was measured using a model DHR3 rheometer produced by TA Instruments.

Experimental Example 2: Folding Test

In-folding operations were repeatedly performed 200,000 times for 240 hours with respect to the display device samples according to Fabrication Example 1. The display device samples include an ultra-thin glass as a cover window and adhesives #1 to #12 obtained in Fabrication Example 2, and PSA were applied to the respective display device samples. Some of the display device samples were subjected to the in-folding operations under first conditions of a temperature of 60° C. and a humidity of 93%, and the other display device samples were subjected to the in-folding operations under second conditions of a variable temperature ranging from −40° C. to 85° C. and a humidity of 93%. Here, the variable temperature ranging from −40° C. to 85° C. was achieved by increasing the temperature from −40° C. to 85° C. and then decreasing the temperature to −40° C. again in one cycle, and repeating the cycles.

Figure 11:
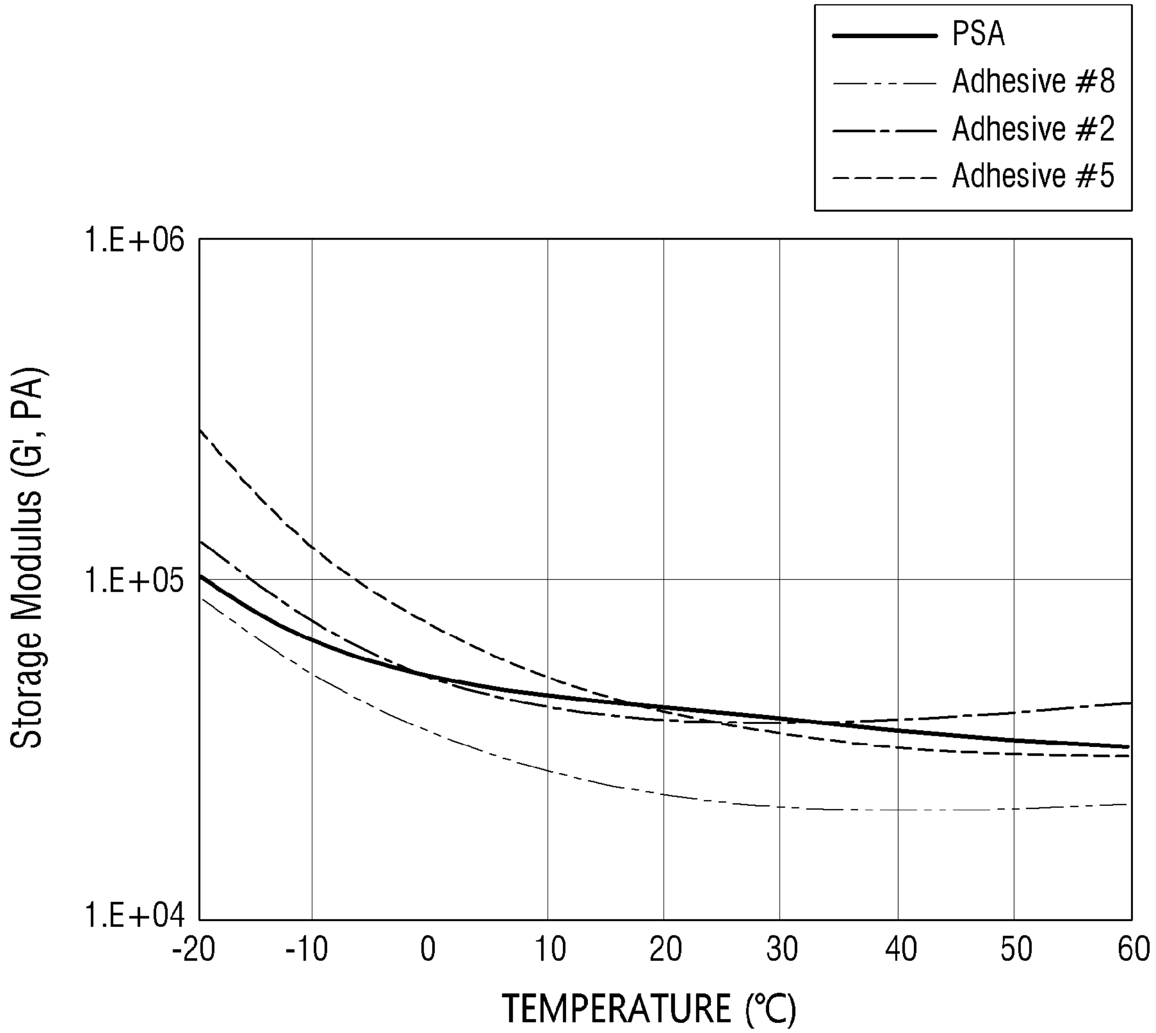
FIG. 11 is a graph showing the storage modulus of PSA and adhesives #2, #5 and #8 according to Experimental Example 1.

Table 1 below shows the viscosity of each sample at room temperature along with the results of Experimental Examples 1 and 2. The storage modulus of PSA and of adhesives #2, #5, and #8 are shown in FIG. 11. In Table 1, the temperature-dependent index is the ratio of the storage modulus of the adhesive measured at a temperature of −20° C. to the storage modulus of the adhesive measured at a temperature of 60° C. In addition, in the results of the folding test, o indicates that the adhesive is not detached from a layer, whereas X indicates that the adhesive is detached from the layer.

TABLE 1

| Adhesive | Storage modulus (MPa) (−20° C.) | Storage modulus (MPa) (60° C.) | Temperature dependent index | Folding test result | Viscosity (cp) |
|---|---|---|---|---|---|
| PSA | 0.101 | 0.032 | 3.1 | ○ | — |
| #1 | 0.105 | 0.036 | 2.9 | ○ | 22 |
| #2 | 0.133 | 0.044 | 3.0 | ○ | 19 |
| #3 | 0.090 | 0.022 | 4.0 | X | 20 |
| #4 | 0.137 | 0.015 | 8.9 | X | 21 |
| #5 | 0.282 | 0.030 | 9.3 | ○ | 30 |
| #6 | 0.237 | 0.025 | 9.4 | ○ | 31 |
| #7 | 0.188 | 0.020 | 9.6 | X | 21 |
| #8 | 0.095 | 0.007 | 12.7 | X | 4 |
| #9 | 0.252 | 0.020 | 12.8 | X | 16 |
| #10 | 0.099 | 0.006 | 15.7 | X | 7 |
| #11 | 0.187 | 0.011 | 16.4 | X | 12 |
| #12 | 0.373 | 0.014 | 26.0 | X | 11 |

As can be seen from Table 1 and FIG. 11, adhesives #1, #2, #5, and #6 pass the folding test, and the temperature-dependent index is greater than 1 and less than 10, which is equivalent to the PSA of the control. It can also be seen that adhesives #1 to #12 exhibit a low viscosity of 40 cp or less at room temperature.

Experimental Example 3: Measurement of Storage Modulus in Frequency Region

The storage modulus (G') and loss modulus (G") of the adhesives #1, #2, #4, #5, #6, #7, #9 according to Fabrication Example 2 and of PSA were measured using a rheometer under the same conditions as in Experimental Example 1, except that a frequency of $10^{-2}$ to $10_2$ Hz was applied thereto at room temperature. The rheometer was used to measure only the modulus in the frequency range of $10^{-2}$ to $10^2$ Hz. Accordingly, the storage modulus and loss modulus were obtained in the entire frequency range of $10^{-2}$ to $10^8$ Hz by measuring the modulus with the rheometer and converting the same through temperature time superposition (TTS).

Experimental Example 4: Impact Resistance Test

A pen (7 mm in diameter, 5.8 g in weight) having a stainless steel ball was dropped on the display device samples according to Fabrication Example 1, and the dropping height of the pen at which bright spots and cracks are formed in the display device samples were observed. At this time, the drop position of the pen was tested in a folding part ('FDA' in FIG. 1) and a non-folding part ('NFA1' in FIG. 1) of each display device sample. The display device samples had an ultra-thin glass as a cover window, and adhesives #1, #2, #4, #5, #6, #7 and #9 according to Fabrication Example 2, and PSA were applied to the respective display device samples.

Figure 12:
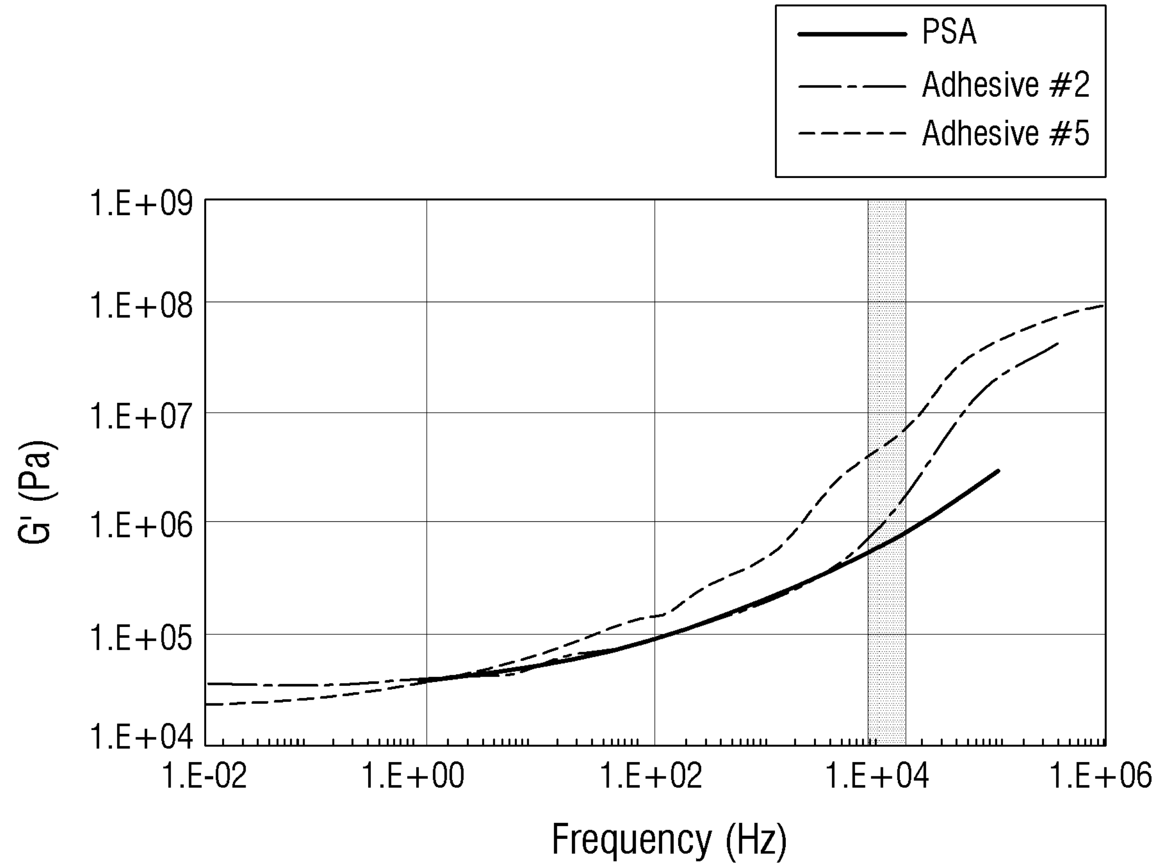
FIG. 12 is a graph showing the storage modulus of PSA and adhesives #2 and #5 in each frequency region according to Experimental Example 3.
Figure 13:
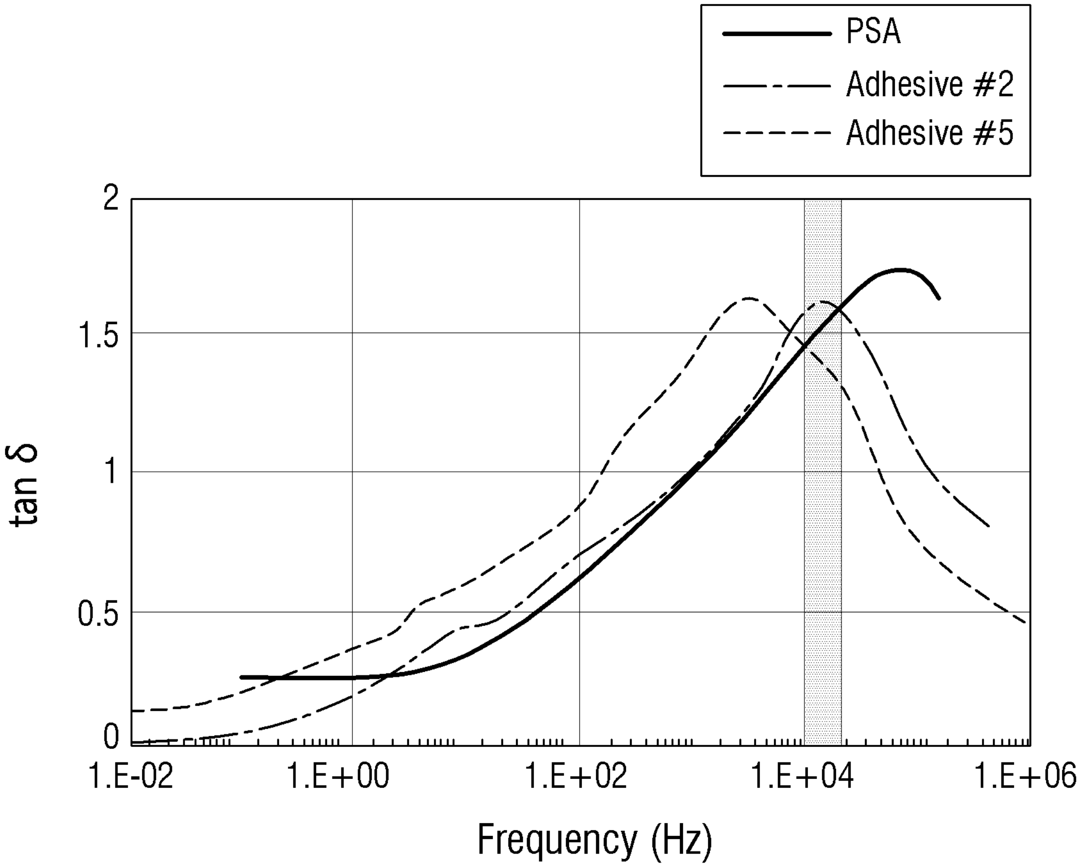
FIG. 13 is a graph showing tan δ values of PSA and adhesives #2 and #5 according to Experimental Example 3.

The results of Experimental Examples 3 and 4 are shown in Table 2 below. Table 2 below shows the storage modulus (G'), loss modulus (G"), and tan δ value (ratio of G" to G') of the adhesives at 10 kHz. In the results of the impact resistance test, o indicates a measured value of a display device sample to which PSA was applied, X indicates a value lower than the value of o, and ◎ indicates a value higher than the value of o. In addition, FIGS. 12 and 13 show the storage modulus and tan δ values, respectively, of PSA and adhesives #2 and #5 in each frequency region among the results according to Experimental Example 3.

Figure 14:
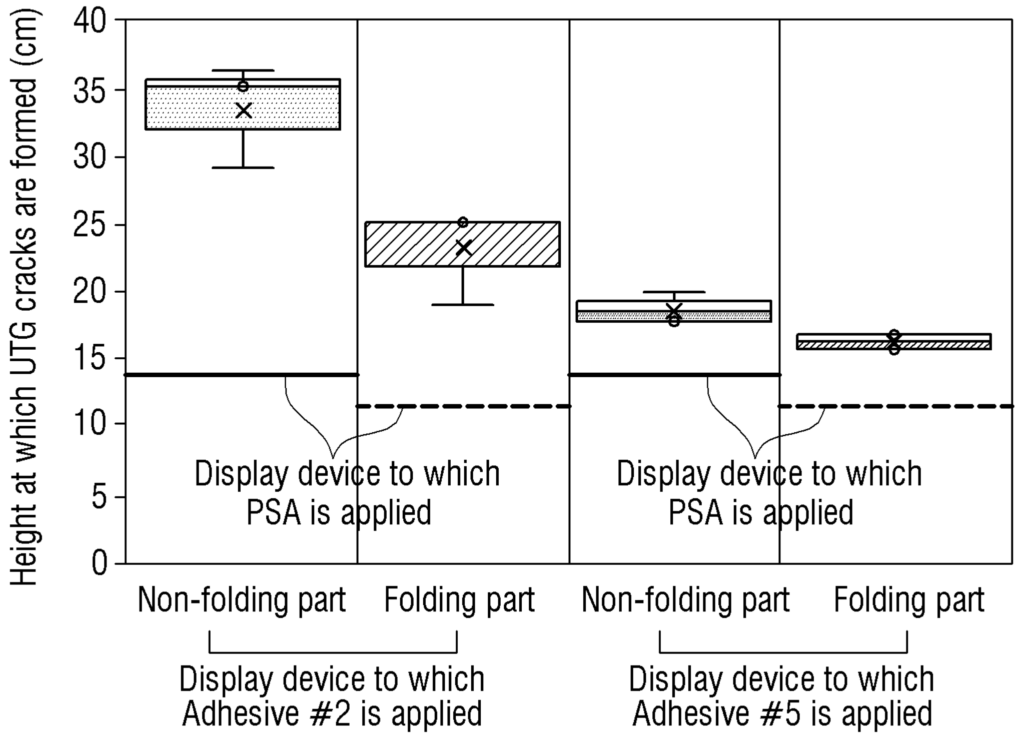
FIG. 14 is a graph showing the height at which UTG cracks are formed in the display device samples according to Experimental Example 4.
Figure 15:
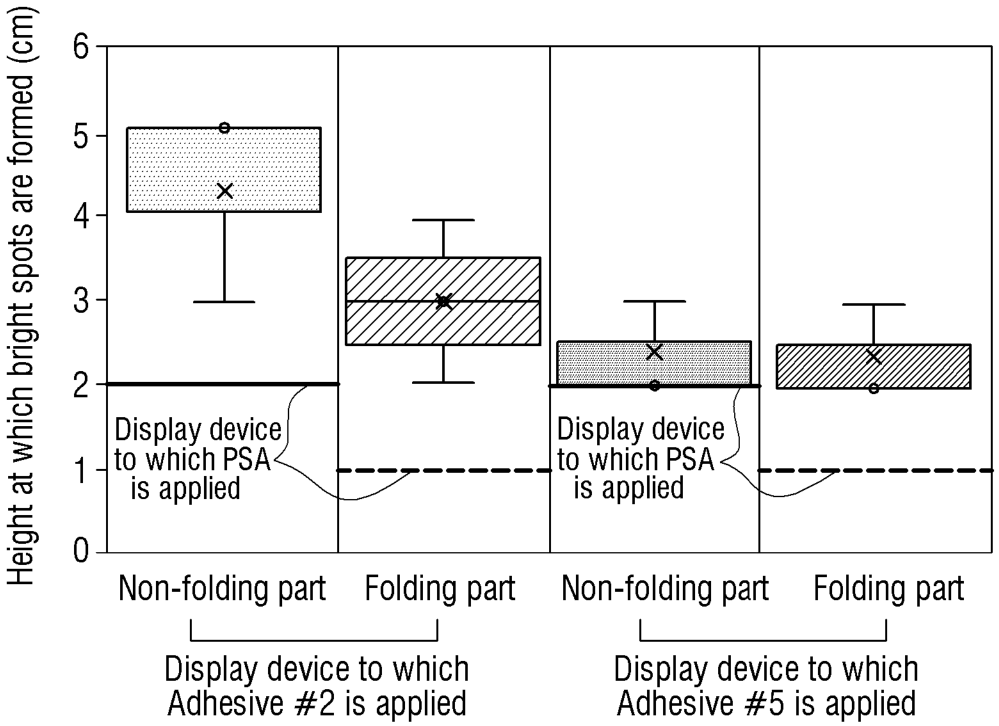
FIG. 15 is a graph showing the height at which bright spots are formed on the display device samples according to Experimental Example 4.

Table 3 below shows the results of an impact resistance test on the display device samples to which PSA and adhesives #2 and #5 are applied, among the results according to Experimental Example 4. FIG. 14 shows the height at which UTG cracks are formed in the display device samples, and FIG. 15 shows the height at which bright spots are formed on the display device samples.

TABLE 2

| Adhesive | Storage modulus (MPa) | tan δ | Impact resistance test result |
|---|---|---|---|
| PSA | 0.74 | 1.55 | ○ |
| #1 | 0.67 | 1.85 | ○ |
| #2 | 1.73 | 1.62 | ◎ |
| #4 | 8.82 | 0.94 | X |
| #5 | 7.07 | 1.47 | ◎ |
| #6 | 3.06 | 1.51 | ○ |
| #7 | 0.45 | 1.67 | X |
| #9 | 1.00 | 1.88 | X |

TABLE 3

| Failure mode | Region | Display device to which PSA is applied | Display device to which adhesive #2 is applied | Display device to which adhesive #5 is applied |
|---|---|---|---|---|
| Bright spots | Non-folding part | 2 cm | 3 cm | 2 cm |
| | Folding part | 1 cm | 2 cm | 2 cm |
| Cracks | Non-folding part | 14 cm | 29 cm | 18 cm |
| | Folding part | 12 cm | 19 cm | 16 cm |

Table 2 and FIGS. 12 and 13 show that adhesives #2 and #5, satisfying a storage modulus greater than 0.7 MPa and a tan δ value greater than 1.4, have improved impact resistance compared to the control, PSA.

Table 3, and FIGS. 14 and 15 show that the display device samples to which adhesives #2 and #5 are applied exhibit greater pen height at which bright spots or cracks are formed in the non-folding part and the folding part compared to the display device samples to which the control, PSA, is applied. The result proved that the display device samples to which adhesives #2 and #5 are applied have improved impact resistance compared to the display device samples to which the control, PSA, is applied.

Experimental Example 5: Impact Resistance Simulation

A pen with a stainless steel ball (7 mm in diameter, 5.8 g in weight) was dropped on display device samples, to which PSA and adhesives #2 and #5 were applied, from a height of 50 mm, and the amount of physical change of the display device (the amount of change in the depth to which the surface of the display device was indented by the pen) was simulated when bright spots and cracks are formed in the display device samples. The results are shown in Table 4 below.

TABLE 4

| Adhesive | Bright spots | Cracks |
|---|---|---|
| PSA | 1.07% | 4.13% |
| #2 | 0.75% | 4.69% |
| #5 | 0.97% | 4.10% |

Table 4 shows adhesives #2 and #5 exhibit the same level of physical change, in which bright spots and cracks are formed, as the control, PSA. This proves that adhesives #2 and #5 exhibit the same impact resistance as the control, PSA.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An adhesive comprising:
an acrylic monomer; and
a crosslinking agent, wherein
a storage modulus of the adhesive after curing the adhesive at a temperature of about −20° C. divided by a storage modulus of the adhesive after curing the adhesive at a temperature of about 60° C. is greater than about 1 and less than about 10.

2. The adhesive of claim 1, wherein the acrylic monomer includes at least one of n-hexyl acrylate (n-HA), 2-ethylhexyl acrylate (2-EHA), 2-hydroxyethyl acrylate (2-HEA), 4-hydroxybutyl acrylate (4-HBA), and dihydroxyhexyl acrylate (DHHA).

3. The adhesive of claim 1, wherein the crosslinking agent includes at least one of ethylene diacrylate (EDA) and 3,3,5-trimethyl-5-(isocyanatomethyl)cyclohexyl isocyanate (IPDI).

4. The adhesive of claim 1, wherein the adhesive has a viscosity of about 10 cp to about 40 cp.

5. The adhesive of claim 1, wherein after curing the adhesive, the storage modulus of the adhesive at a temperature of about −20° C. is in a range of about 0.09 MPa to about 0.3 MPa.

6. The adhesive of claim 1, wherein after curing the adhesive, the storage modulus of the adhesive at a temperature in a range of about −10° C. to about 60° C. is in a range of about 104 Pa to about 107 Pa.

7. The adhesive of claim 1, wherein after curing the adhesive, a ratio of a loss modulus of the adhesive to a storage modulus of the adhesive at a frequency in a range of about 1 kHz to about 100 kHz is in a range from about 1.4 to about 1.9.

8. The adhesive of claim 7, wherein after curing the adhesive, a storage modulus of the adhesive at a frequency in a range of about 1 kHz to about 100 kHz is in a range from about 0.7 MPa to about 8 MPa.

9. The adhesive of claim 1, wherein:
4-hydroxybutyl acrylate (4-HBA) and 2-ethylhexyl acrylate (2-EHA) are included as the acrylic monomer,
ethylene diacrylate (EDA) is included as the crosslinking agent,
the crosslinking agent and the 4-hydroxybutyl acrylate (4-HBA) were mixed at a ratio of 0.9:0.7, and
an adhesion promoter.

10. The adhesive of claim 1, wherein:
4-hydroxybutyl acrylate (4-HBA), dihydroxyhexyl acrylate (DHHA) and 2-ethylhexyl acrylate (2-EHA) are included as the acrylic monomer,
ethylene diacrylate (EDA) is included as the crosslinking agent, and
an adhesion promoter.

* * * * *